United States Patent
Achuthan et al.

(10) Patent No.: US 7,294,573 B1
(45) Date of Patent: Nov. 13, 2007

(54) METHOD FOR CONTROLLING POLY 1 THICKNESS AND UNIFORMITY IN A MEMORY ARRAY FABRICATION PROCESS

(75) Inventors: Krishnashree Achuthan, San Ramon, CA (US); Unsoon Kim, San Jose, CA (US); Kashmir Sahota, Fremont, CA (US); Patriz C. Regalado, San Francisco, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 393 days.

(21) Appl. No.: 11/035,188

(22) Filed: Jan. 13, 2005

(51) Int. Cl.
*H01L 21/302* (2006.01)
*H01L 21/461* (2006.01)

(52) U.S. Cl. ......... 438/684; 257/E21.54; 257/E21.545; 438/404; 438/633

(58) Field of Classification Search ............... 438/684, 438/633, 404, 453; 257/E21.54, E21.545
See application file for complete search history.

(56) References Cited

U.S. PATENT DOCUMENTS

| 6,010,942 A | * | 1/2000 | Chien et al. | 438/396 |
| 6,054,733 A | * | 4/2000 | Doan et al. | 257/315 |
| 2003/0071306 A1 | * | 4/2003 | Huang et al. | 257/344 |

* cited by examiner

*Primary Examiner*—Caridad Everhart
(74) *Attorney, Agent, or Firm*—Farjami & Farjami LLP

(57) ABSTRACT

According to one exemplary embodiment, a method includes planarizing a layer of polysilicon situated over field oxide regions on a substrate to form polysilicon segments, where the polysilicon segments have top surfaces that are substantially planar with top surfaces of the field oxide regions, and where the field oxide regions have a first height and the polysilicon segments have a first thickness. The method further includes removing a hard mask over a peripheral region of the substrate. According to this exemplary embodiment, the method further includes etching the polysilicon segments to cause the polysilicon segments to have a second thickness, which causes the top surfaces of the polysilicon segments to be situated below the top surfaces of the field oxide regions. The polysilicon segments can be etched by using a wet etch process. The polysilicon segments are situated in a core region of the substrate.

18 Claims, 4 Drawing Sheets

METHOD FOR CONTROLLING POLY 1 THICKNESS AND UNIFORMITY IN A MEMORY ARRAY FABRICATION PROCESS

TECHNICAL FIELD

The present invention is generally in the field of semiconductor devices. More particularly, the present invention is in the field of fabrication of memory arrays.

BACKGROUND ART

Conventional memory array, such a flash memory array, typically includes one or more high-density core regions and a low-density periphery region on a single substrate. Memory transistors in the core have a substantially similar stacked gate structure. The stacked gate structure includes a floating gate comprising a first layer of polysilicon (poly 1) underneath a control gate. The control gate comprises a second layer of polysilicon (poly 2).

Processing steps for fabricating a memory array, such as a flash memory array, include, among other steps, forming a gate oxide layer and isolation regions in core and peripheral regions of a substrate. Poly 1 is deposited over the gate oxide layer and the isolation regions and a chemical mechanical polish ("CMP") process is typically used to planarize the poly 1 in the core region while a hard mask protects the poly 1 in the peripheral region of the substrate. As a result of the CMP process, poly 1 segments are formed between isolation regions such that the top surfaces of the poly 1 segments and the top surfaces of the isolation regions form a planar surface.

In a conventional fabrication process, a CMP "over-polish" process is typically performed to reduce the thickness of the poly 1 segments to a desired final thickness. However, the CMP "over-polish" process causes undesirable core erosion without providing good stopping capability. As a result, an accurate final thickness of poly 1 segments is difficult to achieve by using the CMP "over-polish process. Furthermore, the CMP "over-polish" process causes undesirable non-uniformity in the poly 1 segments, which undesirably affects a subsequent gate etch process.

Thus, there is a need in the art for a method of fabricating a memory array, such as a flash memory array, that achieves a desired poly 1 final thickness while avoiding undesirable non-uniformity and core erosion caused by a CMP "over-polish" process.

SUMMARY

The present invention is directed to method for controlling poly 1 thickness and uniformity in a memory array fabrication process. The present invention addresses and resolves the need in the art for a method of fabricating a memory array, such as a flash memory array, that achieves a desired poly 1 final thickness while avoiding undesirable non-uniformity and core erosion caused by a CMP "over-polish" process.

According to one exemplary embodiment, a method includes planarizing a layer of polysilicon situated over field oxide regions on a substrate to form polysilicon segments, where the polysilicon segments have top surfaces that are substantially planar with top surfaces of the field oxide regions, and where the field oxide regions have a first height and the polysilicon segments have a first thickness. A CMP process can be used to planarize the layer of polysilicon. The first height of the field oxide regions can be equal to a distance between a gate oxide layer situated on the substrate and top surfaces of the field oxide regions. The method further includes removing a hard mask over a peripheral region of the substrate.

According to this exemplary embodiment, the method further includes etching the polysilicon segments to cause the polysilicon segments to have a second thickness, which causes the top surfaces of the polysilicon segments to be situated below the top surfaces of the field oxide regions, where the polysilicon segments are situated in a core region of the substrate. The polysilicon segments can be etched by using a wet etch process. The steps of etching the polysilicon segments and removing the hard mask can be performed in a single process tool. The second thickness may be approximately 600.0 Angstroms, for example.

The method further includes recessing the field oxide regions to cause the field oxide regions to have a second height, where the second height is substantially equal to the second thickness of the polysilicon segments. The steps of etching the polysilicon segments, removing the hard mask, and recessing the field oxide regions can be performed in a single process tool, for example. Other features and advantages of the present invention will become more readily apparent to those of ordinary skill in the art after reviewing the following detailed description and accompanying drawings.

DETAILED DESCRIPTION OF THE INVENTION

Figure 1:
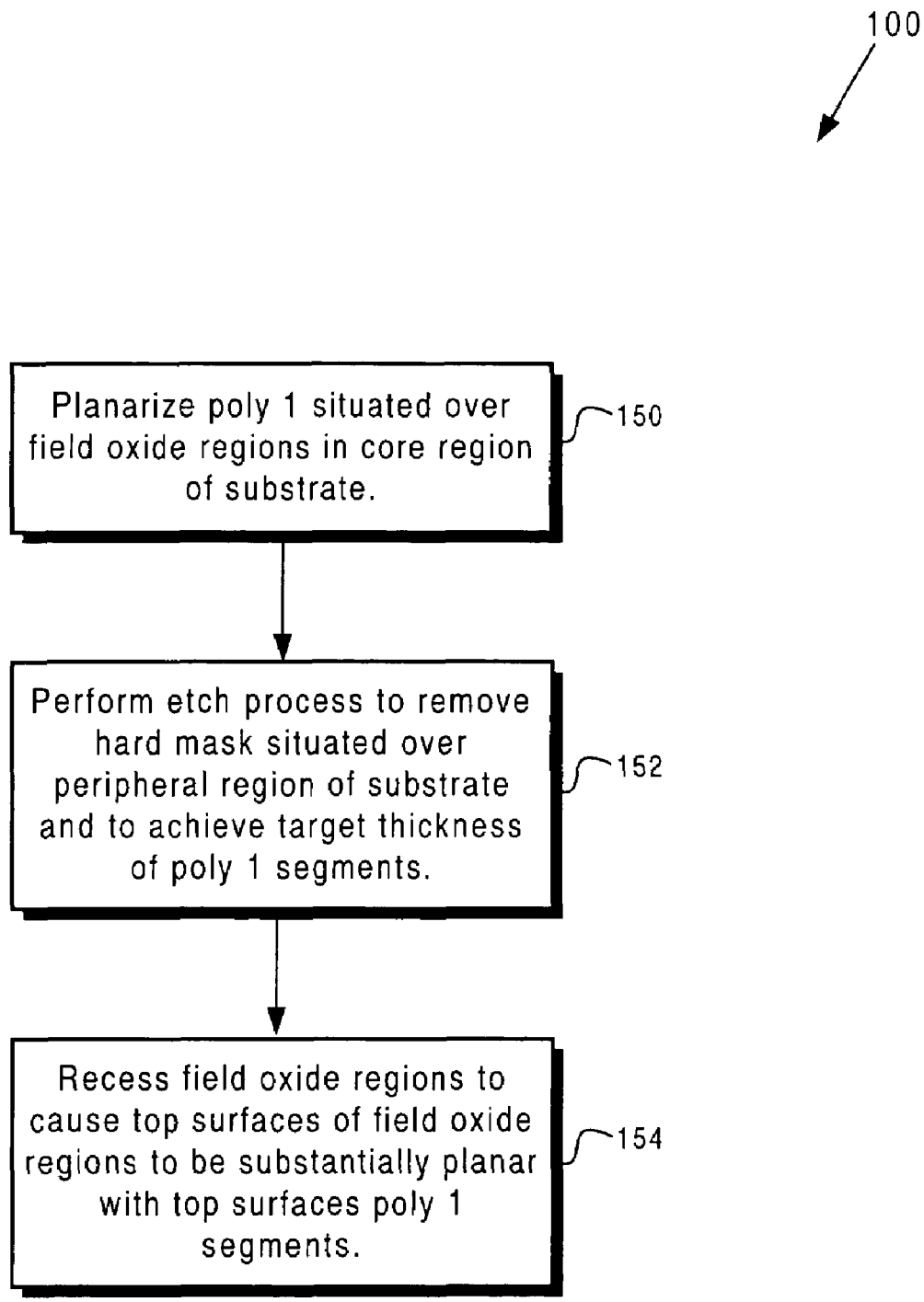
FIG. 1 is a flowchart corresponding to exemplary method steps according to one embodiment of the present invention.

The present invention is directed to method for controlling poly 1 thickness and uniformity in a memory array fabrication process. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as is known in the art. While steps 150 through 154 indicated in flowchart 100 are sufficient to describe one embodiment of the present invention, other embodiments of the invention may use steps different from those shown in flowchart 100.

Figure 2A:
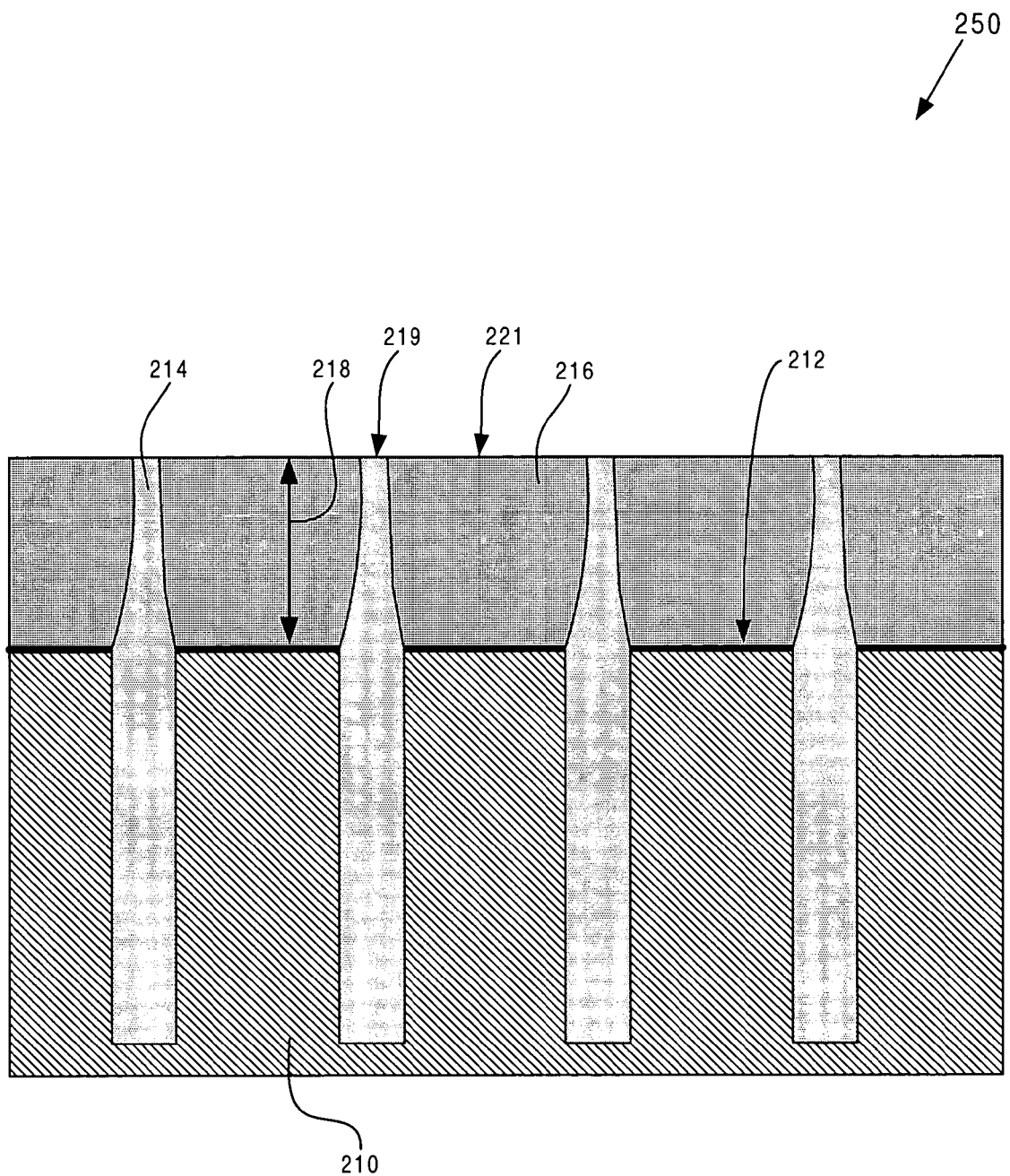
FIG. 2A illustrates a cross-sectional view, which includes portions of an exemplary structure fabricated according to an embodiment of the present invention and a corresponding process step of the flowchart of FIG. 1.
Figure 2B:
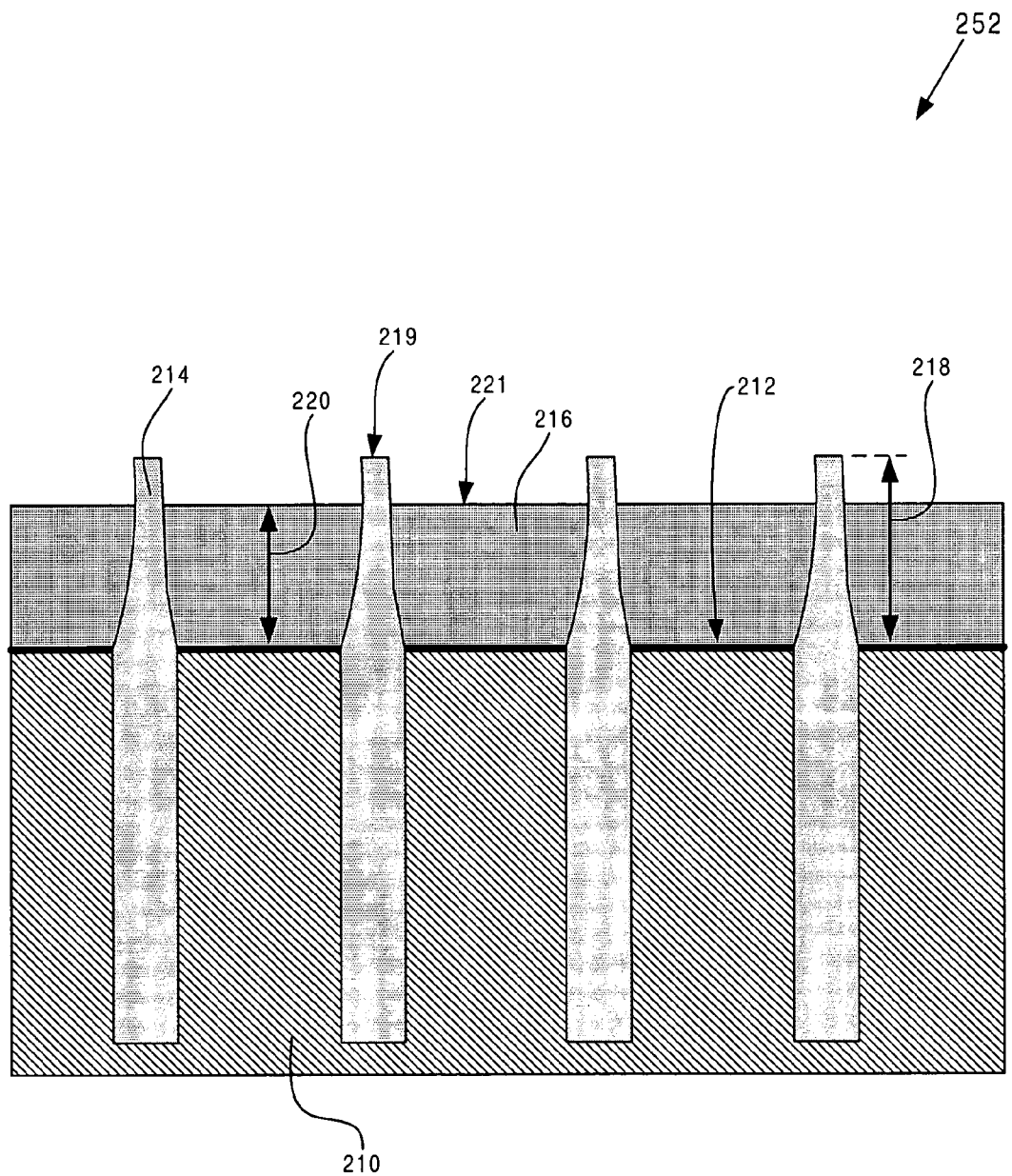
FIG. 2B illustrates a cross-sectional view, which includes portions of an exemplary structure fabricated according to an embodiment of the present invention and a corresponding process step of the flowchart of FIG. 1.
Figure 2C:
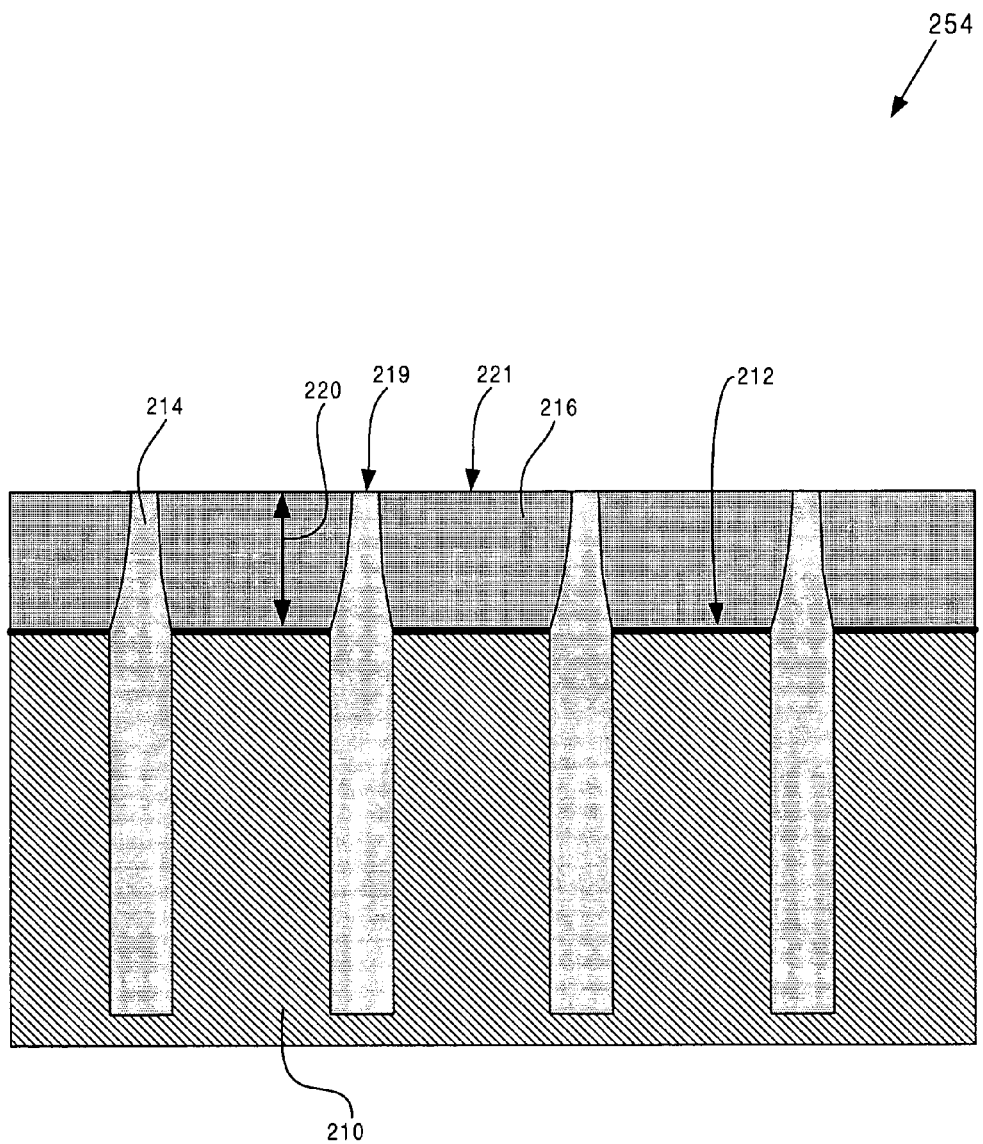
FIG. 2C illustrates a cross-sectional view, which includes portions of an exemplary structure fabricated according to an embodiment of the present invention and a corresponding process step of the flowchart of FIG. 1.

Referring to FIGS. 2A, 2B, and 2C, each of structures 250, 252, and 254 illustrates the result of performing steps 150, 152, and 154, respectively, of flowchart 100 of FIG. 1. For example, structure 250 shows the result of performing step 150, structure 252 shows the result of performing step 152, and so forth.

Reference is now made to step 150 in flowchart 100 of FIG. 1, and the resulting structure 250 in FIG. 2A. Structure 250 is a portion of a structure formed after poly 1 has been planarized at step 150, which occurs during fabrication of an exemplary memory array, such as a flash memory array, in a core region of a substrate. Structure 250 includes, among other things, substrate 210 with gate oxide layer 212 residing thereon. Field oxide regions 214 are situated in substrate 210 and can comprise silicon oxide. Field oxide regions 214 can be formed by using a high density plasma (HDP) process or other appropriate process. Poly 1 segments 216 are situated above gate oxide layer 212 and have top surfaces 221.

As stated above, at step 150, a planarizing process is performed on poly 1, which causes poly 1 segments 216 to be formed by removing excess poly 1 portions above field oxide regions 214. As a result of the planarizing process, top surfaces 221 of poly 1 segments 216 are substantially planar with top surfaces 219 of field oxide regions 214. However, it is possible that top surfaces 221 of poly 1 segments 216 would undergo "micro dishing"; in other words, top surfaces 221 could, in some circumstances, finish slightly lower than top surfaces 219 of field oxide regions 214. If such micro dishing does take place, the subsequent step 152 (discussed below) would be appropriately adjusted to reduce poly 1 etch to compensate for the thinner poly 1 segments 216.

The planarizing process can be performed by using a CMP process that is selective to silicon oxide such that the CMP process stops at top surfaces 219 of field oxide regions 214, which have height 218. Height 218 of field oxide regions 214 represents the distance between gate oxide layer 212 and top surfaces 219 of field oxide regions 214. Thus, height 218 of field oxide regions 214 determines the endpoint of the CMP process and, consequently, the thickness of poly 1 segments 216, which is substantially equal to height 218.

Referring to step 152 in FIG. 1 and structure 252 in FIG. 2B, at step 152 of flowchart 100, an etch process is performed to remove a hard mask situated over a peripheral region of substrate 210 and to reduce the thickness of poly 1 segments 216 to target thickness 220. The hard mask (the hard mask is not shown in any of the figures in the present application), which is situated over the peripheral region (the peripheral region is not shown in any of the figures in the present application) of substrate 210, can comprise high temperature oxide (HTO) and can be removed in a first step of the etch process by using a wet etchant such as dilute hydrofluoric (HF) acid or other appropriate wet etchant. By way of background, the hard mask is formed over polysilicon areas in the peripheral region of substrate 210 to protect the polysilicon areas from dishing during the planarizing process discussed above.

In a second step (poly 1 etch step) of the etch process, poly 1 segments 216 are reduced to target thickness 220 by etching poly 1 segments 216 using a wet etchant comprising an ammonia peroxide mixture (APM) or other appropriate wet etchant. Target thickness 220, which is a target thickness of poly 1 segments 216 in the core region of substrate 210, can be controlled by appropriately controlling the duration of the poly 1 etch step. By way of example, target thickness 220 of poly 1 segments 216 can be approximately 600.0 Angstroms. In other embodiments, poly 1 segments 216 can have a thickness greater than or less than 600.0 Angstroms.

By using a wet etch to achieve target thickness 220 of poly 1 segments 216, the present invention advantageously provides a process that is extendable to future technologies. For example, for a technology requiring a target thickness of 400.0 Angstroms, by appropriately controlling the duration of the poly 1 etch step, the target thickness of 400.0 Angstroms can be achieved with little re-characterization of the entire poly 1 process module. Also, by etching poly 1 segments 216 in the core region of substrate 210 and the hard mask in the peripheral region of substrate 210 by using an etch process comprising wet etchants, poly 1 segments 216 and the hard mask can be etched in a single process tool.

Referring to step 154 in FIG. 1 and structure 254 in FIG. 2C, at step 154 of flowchart 100, field oxide regions 214 are recessed to cause top surfaces 219 of field oxide regions 214 to be substantially planar with top surfaces 221 of poly 1 segments 216. Field oxide regions 214 can be recessed by using an appropriate wet etch process that is selective to polysilicon and, consequently, will not cause undesirably erosion of poly 1 segments 216. By using a wet etch process to recess field oxide regions 214, field oxide regions 214, the peripheral region hard mask, and poly 1 segments 216 can be advantageously etched in a single process tool. In one embodiment, field oxide regions 214 may be recessed by using a dry etch process. As a result of recessing field oxide regions 214, the height of field oxide regions 214, i.e. the distance between top surfaces 219 of field oxide regions 214 and gate oxide layer 212, is substantially equal to thickness 220 of poly 1 segments 216.

Thus, by using an etch process comprising a wet etchant to achieve a desired target thickness of poly 1 segments, the present invention advantageously achieves poly 1 segments having a substantially uniform thickness. In contrast, a conventional process uses a CMP "over-polish" process to achieve a desired target thickness of poly 1 segments, which produces undesirable core erosion without offering good stopping capability. Moreover, wet etch uniformity achieved by the present invention is far superior to the non-uniformity achieved by the conventional CMP "over-polish" process.

Additionally, by performing steps 152 and 154 using the same process tool, the present invention advantageously achieves a substantial reduction in manufacturing cost compared to a conventional process that uses two separate process tools to implement steps 152 and 154. Moreover, using only one process tool to perform both steps 152 and step 154 saves a substantial amount of manufacturing time.

Furthermore, by removing the hard mask before performing the poly 1 etch step, the present invention advantageously provides the flexibility to be able to reduce peripheral polysilicon thickness or decrease the polysilicon thickness difference between the core and the periphery regions of the substrate.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for controlling poly 1 thickness and uniformity in a memory array fabrication process has been described.

The invention claimed is:

1. A method comprising:
    planarizing a layer of polysilicon situated over field oxide regions on a substrate to form polysilicon segments, said polysilicon segments having top surfaces that are substantially planar with top surfaces of said field oxide regions, said field oxide regions having a first height and said polysilicon segments having a first thickness;
    etching said polysilicon segments to cause said polysilicon segments to have a second thickness, said step of etching said polysilicon segments causing said top surfaces of said polysilicon segments to be situated below said top surfaces of said field oxide regions, said polysilicon segments being situated in a core region of said substrate;
    recessing said field oxide regions to cause said field oxide regions to have a second height, said second height being substantially equal to said second thickness of said polysilicon segments.

2. The method of claim 1 wherein said step of etching said polysilicon segments comprises using a wet etch process.

3. The method of claim 1 wherein said step of etching said polysilicon segments and said step of recessing said field oxide regions are performed in a single process tool.

4. The method of claim 1 further comprising a step of removing a hard mask over a peripheral region of said substrate prior to said step of etching said polysilicon segments, wherein said step of etching said polysilicon segments, said step of removing said hard mask, and said step of etching said polysilicon segments are performed in a single process tool.

5. The method of claim 1 wherein said step of planarizing said layer of polysilicon comprises using a chemical mechanical polishing process.

6. The method of claim 1 wherein said first height of said field oxide regions is equal to a distance between a gate oxide layer situated on said substrate and said top surfaces of said field oxide regions.

7. The method of claim 1 wherein said second thickness of said polysilicon segments is less than 600.0 Angstroms.

8. The method of claim 1 further comprising a step of removing a hard mask over a peripheral region of said substrate prior to said step of etching said polysilicon segments.

9. The method of claim 8 wherein said step of etching said polysilicon segments and said step of removing said hard mask are performed in a single process tool.

10. A method of fabricating a memory array, said method comprising:
    planarizing a layer of polysilicon situated over field oxide regions on a substrate to form polysilicon segments, said polysilicon segments having top surfaces that are substantially planar with top surfaces of said field oxide regions, said field oxide regions having a first height and said polysilicon segments having a first thickness, said polysilicon segments being situated in a core region of said substrate;
    removing a hard mask situated over a peripheral region of said substrate;
    etching said polysilicon segments to cause said polysilicon segments to have a second thickness, said step of etching said polysilicon segments causing said top surfaces of said polysilicon segments to be situated below said top surfaces of said field oxide regions;
    wherein said step of removing said hard mask is performed prior to said step of etching said polysilicon segments;
    recessing said field oxide regions to cause said field oxide regions to have a second height, said second height being substantially equal to said second thickness of said polysilicon segments.

11. The method of claim 10 wherein said step of etching said polysilicon segments comprises using a wet etch process, wherein said wet etch process causes substantially no etching of said field oxide regions.

12. The method of claim 10 wherein said step of removing said hard mask, said step of etching said polysilicon segments, and said step of recessing said field oxide regions are performed in a single process tool.

13. The method of claim 10 wherein said step of etching said polysilicon segments and said step of removing said hard mask are performed in a single process tool.

14. The method of claim 10 wherein said step of etching said polysilicon segments comprises using an ammonia peroxide mixture.

15. The method of claim 10 wherein said first height of said field oxide regions is equal to a distance between a gate oxide layer situated on said substrate and said top surfaces of said field oxide regions.

16. The method of claim 10 wherein said second thickness of said polysilicon segments is less than 600.0 Angstroms.

17. The method of claim 10 wherein said step of planarizing said layer of polysilicon comprises using a chemical mechanical polishing process.

18. The method of claim 17 wherein said first height of said field oxide regions determines an endpoint of said chemical mechanical polishing process.

* * * * *